US010691377B2

(12) United States Patent
Alsasua et al.

(10) Patent No.: US 10,691,377 B2
(45) Date of Patent: Jun. 23, 2020

(54) ADJUSTING SCAN EVENT THRESHOLDS TO MITIGATE MEMORY ERRORS

(71) Applicant: Micron Technology, Inc., Boise, ID (US)

(72) Inventors: Gianni Stephen Alsasua, Rancho Cordova, CA (US); Harish Reddy Singidi, Fremont, CA (US); Peter Sean Feeley, Boise, ID (US); Ashutosh Malshe, Fremont, CA (US); Renato Padilla, Jr., Folsom, CA (US); Kishore Kumar Muchherla, Fremont, CA (US); Sampath Ratnam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/138,334

(22) Filed: Sep. 21, 2018

(65) Prior Publication Data

US 2020/0097211 A1 Mar. 26, 2020

(51) Int. Cl.
*G06F 12/00* (2006.01)
*G06F 3/06* (2006.01)
*G11C 16/34* (2006.01)

(52) U.S. Cl.
CPC ............ *G06F 3/0659* (2013.01); *G06F 3/064* (2013.01); *G06F 3/0604* (2013.01); *G06F 3/0679* (2013.01); *G11C 16/3422* (2013.01)

(58) Field of Classification Search
CPC ...... G06F 3/0659; G06F 3/064; G06F 3/0679; G06F 3/0604; G11C 16/3422
See application file for complete search history.

(56) References Cited

U.S. PATENT DOCUMENTS

| | | | |
|---|---|---|---|
| 7,818,525 B1 * | 10/2010 | Frost | G06F 12/0246 365/185.25 |
| 2007/0186040 A1 | 8/2007 | Kasahara et al. | |
| 2011/0041005 A1 | 2/2011 | Selinger | |
| 2013/0107625 A1 | 5/2013 | Yang et al. | |
| 2013/0343131 A1 * | 12/2013 | Wu | G11C 16/26 365/185.24 |
| 2014/0136883 A1 * | 5/2014 | Cohen | G06F 11/2094 714/6.11 |
| 2015/0339188 A1 | 11/2015 | Hu et al. | |
| 2017/0076811 A1 | 3/2017 | Reusswig et al. | |

OTHER PUBLICATIONS

Cai et al., "Error Characterization, Mitigation, and Recovery in Flash Memory Based Solid State Drives", IEEE, 2017 (Year: 2017).*
"International Application Serial No. PCT US2019 051948, International Search Report dated Jan. 7, 2020", 3 pgs.
"International Application Serial No. PCT US2019 051948, Written Opinion dated Jan. 7, 2020", 5 pgs.

* cited by examiner

*Primary Examiner* — Arvind Talukdar
(74) *Attorney, Agent, or Firm* — Schwegman Lundberg & Woessner, P.A.

(57) ABSTRACT

Systems and methods are disclosed, comprising a memory device comprising multiple groups of memory cells, the groups comprising a first group of memory cells and a second group of memory cells configured to store information at a same bit capacity per memory cell, and a processing device operably coupled to the memory device, the processing device configured to adjust a scan event threshold for one of the first or second groups of memory cells to a threshold less than a target scan event threshold for the first and second groups of memory cells to distribute scan events in time on the memory device.

20 Claims, 6 Drawing Sheets

ADJUSTING SCAN EVENT THRESHOLDS TO MITIGATE MEMORY ERRORS

TECHNICAL FIELD

Embodiments of the disclosure relate generally to memory sub-systems, and more specifically, to adjusting scan event thresholds for groups of memory cells.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
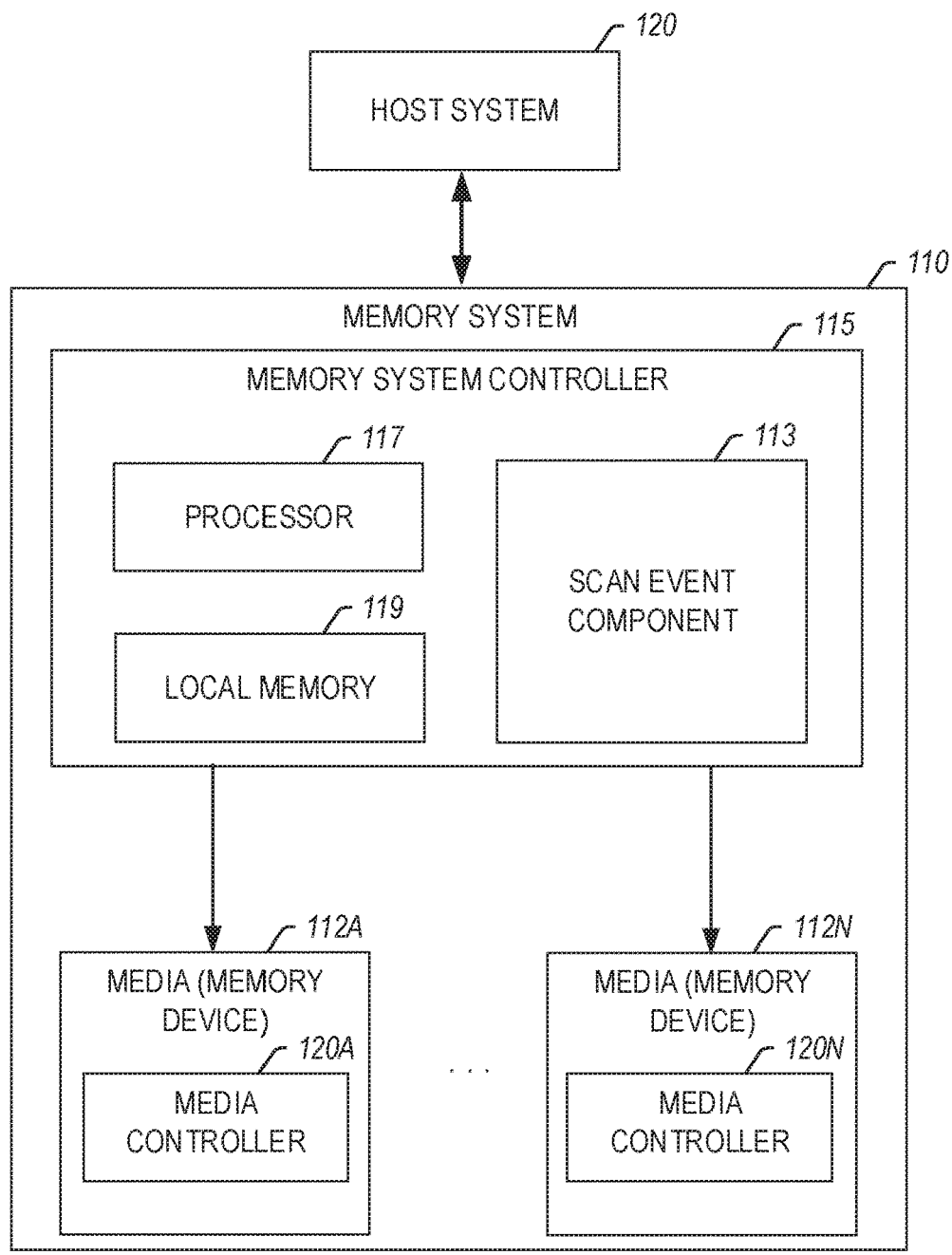
FIG. 1 illustrates an example computing environment comprising a memory system, in accordance with some examples of the present disclosure.

Aspects of the present disclosure are directed to scheduling or performing scan or fold events, or adjusting scan or fold event thresholds for different groups of memory cells (e.g., blocks, pages, etc.) in a memory system. An example of a memory system is a storage system, such as a solid-state drive (SSD). In some embodiments, the memory system is a hybrid memory/storage system. In general, a host system can utilize a memory system that includes one or more memory devices. The memory devices can include non-volatile memory devices, such as, for example, negative-and (NAND). The host system can provide write requests to store data at the memory devices of the memory system and can provide read requests to retrieve data stored at the memory system, such as in one or more arrays of memory cells.

Memory devices, such as FLASH-based devices, may experience one or more errors during operation. For example, the memory cells may degrade due to the repeated reading, writing, and erasing of memory cells. Likewise, errors may be introduced in the operation of the memory system. Reading data from memory cells in a block of memory cells in a memory device can cause changes (e.g., threshold voltage changes, etc.) to nearby memory cells (e.g., memory cells in a block, page, or group of memory cells, or in certain examples, in surrounding blocks, pages, groups, or strings of memory cells) over time, an effect known as read disturbance (read disturb). For example, read disturb errors can occur when a pass-through voltage (Vpass) is applied to memory cells near a memory cell that is being read that shifts the distribution of charge in the cells to which it is applied. If the magnitude of the distribution is great enough, a different value can be read from the memory cell than what was stored.

To ensure reliable data storage and recovery, a memory system can have one or more error detection and one or more error correction mechanisms. For example, memory cells may have Error Correction Codes (ECC) that are generated when the memory cell is written by inputting the value to be stored in the memory device into a mathematical formula to produce an ECC value that is also stored. Later, upon reading the memory cell, the same or complimentary mathematical formula is applied to the value read from the memory cell. The ECC generated at the time the value is written to the memory cell is compared to the ECC generated at the time the value is read from the memory cell to determine an error. For example, if the ECC generated at the time the value is written to the memory device does not match the ECC generated at the time the value is read from the memory device, then the memory cell has experienced an error. Example ECC processes may include parity checks, Hamming codes, checksums, cyclic redundancy checks (CRCs), cryptographic hashes, block codes, convolutional codes, turbo codes, low-density parity check (LDPC) and the like.

A variety of error handling mechanisms may allow a memory device to correct the value read from the memory cell when an error is detected. Error handling mechanisms may be hardware or software based procedures used by a memory system to attempt to correct an error. Error handling mechanisms can be general error handling mechanisms that may work on all types of errors or may be targeted to correct certain error conditions in the memory system. For example, read disturb error handling mechanisms are targeted to recovering read disturb errors. One example error handling mechanism used to correct read disturb errors is shifting the read voltage to a higher voltage to compensate for the shift in charge distribution. Multiple error handling mechanisms may be tried for a given error. For example, there may be multiple error handling mechanisms that are targeted to fixing read disturb errors. Each error handling mechanism may perform different operations and thus may cost a different amount in error handling overhead.

In some examples, it may not be evident to the memory system what the error is. The memory system may simply know that an error detection mechanism (such as an ECC) detected an error. Because there may be multiple error handling mechanisms for a given problem, and because the error cause may be unknown, the memory system may try multiple error handling mechanisms to correct the error. In some examples, the memory system may try one or more of these correction mechanisms in an order specified by a predefined error handling sequence. Error handling sequences may be programmed into the device in hardware, software, or a combination of hardware and software at device manufacture time.

The error handling sequence is developed by the manufacturer based upon expected use cases and environments as well as historical expected success rates, latencies, and controller utilization statistics of the various error handling mechanisms. The predefined error handling sequence amounts to an educated guess by the memory system designers of the best sequence for correcting errors given the time and resource costs associated with each particular error handling mechanism and the expected error types associated with the expected use cases.

A controller configured to control operations associated with the memory device (e.g., reads, writes, etc.) can count the number or reads (read count) associated with a memory cell or group of memory cells (e.g., a block or a page of memory cells, etc.). When the read count for the memory cell or group of memory cells reaches a first scan threshold (e.g., a read count for a block of memory cells without an intervening write, erase, etc., or a gross read count for a block of memory cells, etc.), the controller can scan the block of memory cells for read disturb errors. In an example, a scan event for a group of memory cells can include a read disturb scan configured to determine the threshold voltage distribution of the group of memory cells. If the threshold voltage distribution changes, or if the number of read disturb errors in the memory cells or group of memory cells reaches a first error threshold, or the read count reaches a first read threshold, the controller can refresh the data in the memory cells or group of memory cells in a fold event. In an example, a fold event can include writing the data to different memory cells or a different group of memory cells (e.g., reading the data from a first block of memory cells and writing it to a second block of memory cells, etc.), or otherwise refreshing the data in the memory cells or group of memory cells. A fold event can be triggered by a read count, raw bit error rate (RBER), read disturb errors, or one or more other indications that the stored data should be refreshed.

Drive performance can be defined in terms of read operations (e.g., random or sequential) across a given time interval (e.g., 1 second, etc.). However, in certain operating conditions (e.g., test conditions, 4k virtual reality operation, loading images or galleries, or other sequential data operations, etc.), groups of memory cells (e.g., blocks of memory cells) may experience the same or similar amounts of read counts or read disturb, triggering drive management operations (e.g., scan, fold, etc.) for multiple blocks or groups of memory cells within a time period (e.g., overlapping in time, or within a threshold time, such as 1 second, etc.), impacting performance of an associated memory system. Although a scan event can take a relatively small amount of time (e.g., microseconds), a fold event can take a substantially larger amount of time (e.g., tens of milliseconds). If a number of scans or folds are triggered in a time period, memory system performance, and accordingly, overall system performance, may be impacted.

In an example, in a system comprising multiple groups of memory cells (e.g., blocks, memory devices, etc.), read count scan threshold can be staggered, scattered, or spread apart in time or threshold, such that drive management events (e.g., scans, folds, etc.) are distributed, and not grouped. For example, instead of setting the same read count scan threshold for each group of memory cells, the thresholds can be randomized, skewed, or adjusted such that, in consistent usage conditions, the number of groups of memory cells hitting the read count scan threshold at any time is reduced. In other examples, when multiple groups of memory cells are converging towards the read count scan threshold, one or more groups of memory cells can be pre-emptively scanned, in certain examples, depending on memory system usage, workload, etc. Fold events can be similarly distributed, in certain examples, by adjusting read count thresholds or raw bit error rate (RBER) used to trigger a fold event.

FIG. 1 illustrates an example computing environment 100 including a memory system 110, in accordance with some examples of the present disclosure. The memory system 110 can include media, such as memory devices 112A to 112N. The memory devices 112A to 112N can be volatile memory devices, non-volatile memory devices, or a combination of such. In some embodiments, the memory system is a storage system. An example of a storage system is an SSD. In some embodiments, the memory system 110 is a hybrid memory/storage system. In general, the computing environment 100 can include a host system 120 that uses the memory system 110. In some implementations, the host system 120 can write data to the memory system 110 and read data from the memory system 110.

The host system 120 can be a computing device such as a desktop computer, laptop computer, network server, mobile device, or such computing device that includes a memory and a processing device. The host system 120 or the memory system 110 can be included in a variety of products, such as IoT devices (e.g., a refrigerator or other appliance, sensor, motor or actuator, mobile communication device, automobile, drone, etc.) to support processing, communications, or control of the product. The host system 120 can include a processor, a memory card reader, or one or more other electronic devices external to the memory system 110. The host system 120 can include or be coupled to the memory system 110 so that the host system 120 can read data from or write data to the memory system 110. The host system 120 can be coupled to the memory system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), an eMMC™ interface, etc. The physical host interface can be used to transmit data between the host system 120 and the memory system 110. The host system 120 can further utilize an NVM Express (NVMe) interface to access the memory devices 112A to 112N when the memory system 110 is coupled with the host system 120 by the PCIe interface. The physical host interface can provide an interface for passing control, address, data, and other signals between the memory system 110 and the host system 120.

The memory system 110 is shown, by way of example, to include the memory system controller 115 and media, such as memory devices 112A to 112N. The memory devices 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single-level cells (SLCs) or multi-level cells (MLCs) (e.g., triple-level cells (TLCs) or quad-level cells (QLCs)). In some implementations, a particular memory device can include both an SLC portion and a MLC portion of memory cells (e.g., memory cells having different bit capacities per cell). Each of the memory cells can store bits of data (e.g., data blocks) used by the host system 120. Although non-volatile memory devices such as NAND type flash memory are described, the memory devices 112A to 112N can be based on any other type of memory such as a volatile memory. In some implementations, the memory devices 112A to 112N can be, but are not limited to, random access memory (RAM), read-only memory (ROM), dynamic random-access memory (DRAM), synchronous dynamic random-access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 320 can be grouped as a number of devices, planes, sub-blocks, blocks, or pages that can refer to a unit of the memory device used to store data.

In an example, the memory system 110 can be a discrete memory and/or storage device component of the host system 120. In other examples, the memory system 110 can be a portion of an integrated circuit (e.g., system on a chip (SOC), etc.), stacked or otherwise included with one or more other components of the host system 120.

Each of the media devices 112A to 112N can include a media controller (e.g., media controllers 130A to 130N) to manage the memory cells of the memory devices 112A to 112N.

The memory system 110 can include a memory system controller 115 that can communicate with the memory devices 112A to 112N to perform operations such as reading data, writing data, or erasing data at the memory devices 112A to 112N and other such operations. The memory system controller 115 can include hardware such as one or more integrated circuits and/or discrete components, a buffer memory, or a combination thereof. The memory system controller 115 can be a microcontroller, special purpose logic circuitry (e.g., a field programmable gate array (FPGA), an application specific integrated circuit (ASIC), etc.), or other suitable processor. The memory system controller 115 can include a processor (processing device) 117 configured to execute instructions stored in local memory 119. In the illustrated example, the local memory 119 of the memory system controller 115 includes an embedded memory configured to store instructions for performing various processes, operations, logic flows, and routines that control operation of the memory system 110, including handling communications between the memory system 110 and the host system 120. In some embodiments, the local memory 119 can include memory registers storing, e.g., memory pointers, fetched data, etc. The local memory 119 can also include read-only memory (ROM) for storing micro-code. While the example memory system 110 in FIG. 1 has been illustrated as including the memory system controller 115, in another embodiment of the present disclosure, a memory system 110 may not include a memory system controller 115, and may instead rely upon external control (e.g., provided by an external host, or by a processor or controller separate from the memory system).

In general, the memory system controller 115 can receive commands or operations from the host system 120 and can convert the commands or operations into instructions or appropriate commands to achieve the desired access to the memory devices 112A to 112N. The memory system controller 115 can be responsible for other operations such as wear leveling operations (e.g., garbage collection operations, reclamation), error detection and error-correcting code (ECC) operations, encryption operations, caching operations, block retirement, and address translations between a logical block address and a physical block address that are associated with the memory devices 112A to 112N. The memory system controller 115 can further include host interface circuitry to communicate with the host system 120 via the physical host interface. The host interface circuitry can convert the commands received from the host system into command instructions to access the memory devices 112A to 112N as well as convert responses associated with the memory devices 112A to 112N into information for the host system 120.

The memory system controller 115 can include a set of management tables to maintain various information associated with one or more components of the memory system 110. For example, the information can be associated with a memory device 112A to 112N or one or more memory cells coupled to the memory system controller 115. For example, the management tables can include information regarding block age, block erase count, error history, or one or more error counts (e.g., a write operation error count, a read bit error count, a read operation error count, an erase error count, etc.) for one or more blocks of memory cells coupled to the memory system controller 115. In certain examples, if the number of detected errors for one or more of the error counts is above a threshold, then the bit error can be referred to as an uncorrectable bit error. The management tables can maintain a count of correctable or uncorrectable bit errors, among other things.

The memory system controller 115 can detect or correct errors associated with writing data to or reading data from one or more memory cells of the memory devices 112A to 112N. The memory system controller 115 can actively detect and recover from error occurrences (e.g., bit errors, operation errors, etc.) associated with various operations or storage of data, while maintaining integrity of the data transferred between the host system 120 and the memory system 110, or maintaining integrity of stored data (e.g., using redundant array of independent disks (RAID) storage, etc.), and can remove (e.g., retire) failing memory resources (e.g., memory cells, memory arrays, pages, blocks, etc.) to prevent future errors.

The memory system controller 115 can calculate an ECC upon writing a value to the memory devices 112A to 112N and stores this value in a different location in the memory devices 112A to 112N. Upon reading a value from the memory devices 112A to 112N, the memory system controller 115 can calculate an ECC value for the value read and compare that to the stored ECC value. If the ECC values do not match, the memory system controller 115 can determine that an error has occurred. The memory system controller 115 can execute one or more error handling mechanisms in an order specified according to an error handling sequence in an attempt to correct the error. The error handling sequence can be stored in a data structure on a component of the memory system 110. The memory system controller 115 can continue trying error handling mechanisms until either the error is corrected or there are no more error handling sequences.

The memory system controller 115 can track one or more error handling metrics. Examples include one or more of the number of times the error handling mechanisms are needed (e.g., EH_COUNTER), the number of times each particular error handling metric is utilized, the number of times each error handling mechanism successfully fixes an error, a latency of each error handling mechanism, and the like. In some examples, the memory system controller 115 tracks an overall latency—that is, how much time the system utilizes correcting errors each time it needs to correct errors. The collected metrics can be stored in a same or different data structure as the error handling sequence.

The memory system 110 can include a scan event component 113 (e.g., circuitry, processing device, dedicated logic, programmable logic, firmware, etc.) to perform the operations described herein, such as one or more scan or fold events described herein. In an example, the scan event component 113 can be configured to adjust a scan or fold event threshold for one or more groups of memory cells, such as to distribute scan or fold events in time on the memory device to limit the number of scan or fold events that occur in a given period of time.

The memory system 110 can also include additional circuitry or components that are not illustrated. In some implementations, the memory system 110 can include a cache or buffer (e.g., DRAM) and address circuitry (e.g., a row decoder and a column decoder) that can receive an address from the controller 115 and decode the address to access the memory devices 112A to 112N.

Figure 2:
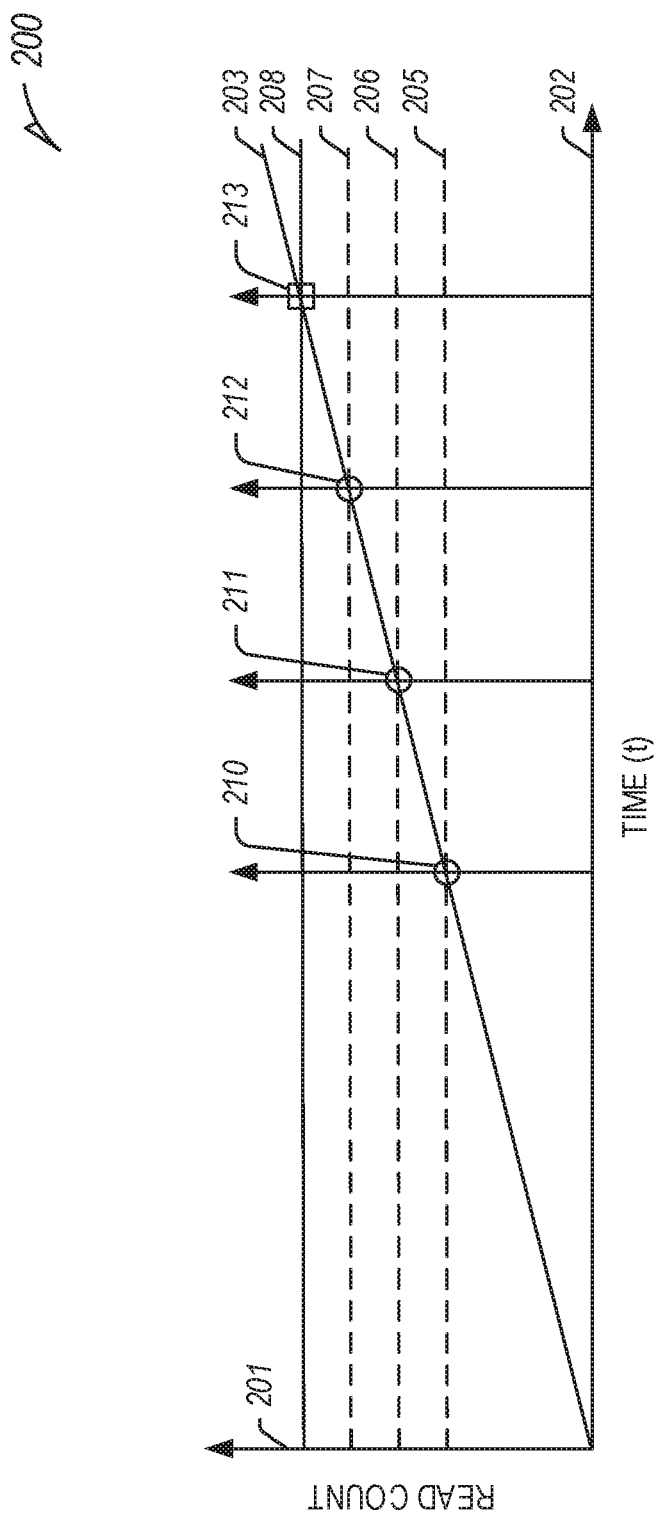
FIGS. 2-4 illustrate example relationships between read counts and time for different scan events, in accordance with some embodiments of the present disclosure.

FIG. 2 illustrates an example relationship 200 between a read count 201 and time (t) 202 for different scan events, including first, second, third, and fourth scan events 210-213 at respective first, second, third, and fourth read count thresholds 205-208. Under consistent or near-consistent read workloads, the read count for each group of memory cells will increase linearly, or nearly-linearly, with time (t), such as illustrated as a first accumulated read count 203.

The fourth scan threshold 208 can illustrate a target read count threshold (e.g., an ideal read count threshold determined for a group of memory cells given typical operation conditions). In typical operation, without adjusting the scan thresholds, each group of memory cells (e.g., block of memory cells) are scanned at the target threshold. In certain examples, multiple groups of memory cells can be scanned at the fourth scan event 213, impacting memory device performance. To avoid scanning multiple groups of memory cells at the same time, or within a given time period, the read count thresholds of different groups of memory cells can be skewed or adjusted from the target read count threshold to one or more other thresholds (e.g., above or below the target read count threshold).

For example, the first, second, and third scan event thresholds 205-207 are offset, skewed, or adjusted from the fourth scan event threshold 208. In an example, different groups of memory cells can be assigned different thresholds. In certain examples, each group of memory cells can have a unique read count threshold. In other examples, a number of groups of memory cells can share a respective threshold, such that the number of groups of memory cells scanned at a certain time or threshold are reduced. A first group of memory cells (A) can have the first scan event threshold 205 and be scanned at the first scan event 210. A second group of memory cells (B) can have the second scan event threshold 206 and be scanned at the second scan event 211. A third group of memory cells (C) can have the third scan event threshold 207 and be scanned at the third scan event 212. A fourth group of memory cells (D) can have the fourth scan event threshold 208 and be scanned at the fourth scan event 213. In an example, only 1 block can be scanned at a given scan event, or within a given time period (e.g., 1 second, etc.). In an example, if more than one group of memory cells reaches a respective or target threshold at a given time, the groups can be queued and scanned at the next available scan interval, such as in the order received, with respect to read counts, etc. In an example, the scan events can include read disturb scans.

Figure 3:
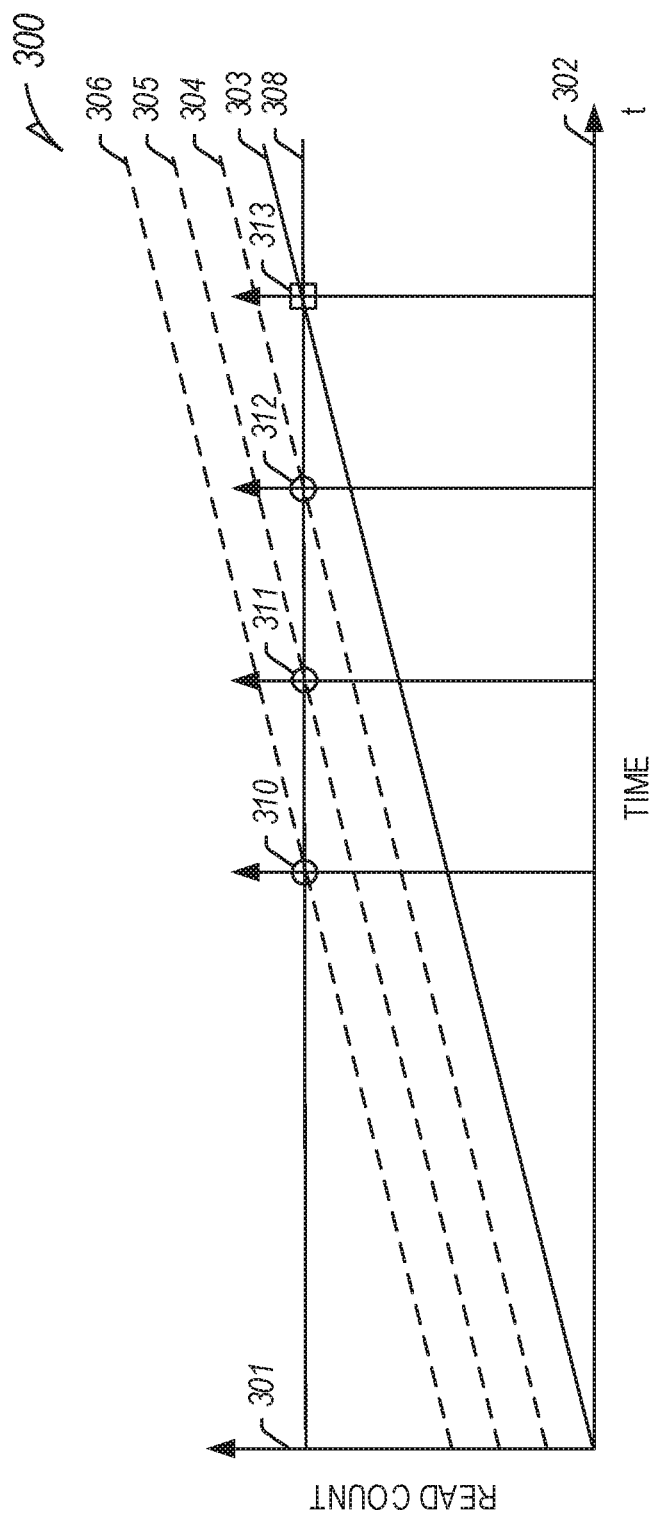

FIG. 3 illustrates an example relationship 300 between a read count 301 and a time (t) 302 for different scan events, including first, second, third, and fourth scan events 310-313 at a scan threshold 308. Whereas, in the example of FIG. 2, the scan thresholds are adjusted for different groups of memory cells, here, the read counts for different groups of memory cells are deliberately skewed or staggered, above or below their actual read count. In an example, to ensure that all groups of memory cells are scanned at or around the scan threshold 308, the read counts can be adjusted above their actual read count.

At the origin of the time (t) 302 axis in FIG. 3, different accumulated read counts (e.g., first, second, third, and fourth read counts 303-306) are shown, illustrating different initial read counts for different groups of memory cells. In an example, read counts for different groups of memory cells can be adjusted (e.g., start at a non-zero number, or skewed, etc.), such that, under consistent usage (e.g., read operations) conditions, the different groups of memory cells will reach the scan threshold 308 at different times. In other examples, if non-zero read counts are increasing at a steady rate for different groups of memory cells, or if consistent usage conditions are detected, the read count for one or more of those groups can be increased or adjusted away from the actual read count.

In an example, a first group of memory cells reaches the scan threshold 308 at a first time and are scanned at the first scan event 310. A second group of memory cells reaches the scan threshold 308 at a second time and are scanned at the second scan event 311. A third group of memory cells reaches the scan threshold 308 at a third time and are scanned at the third scan event 312. A fourth group of memory cells reaches the scan threshold 308 at a fourth time and are scanned at the fourth scan event 313. Without adjusting the read counts for the different groups (e.g., blocks) of memory cells, the first, second, and third groups of memory cells would have triggered scans at the fourth scan event 313, negatively impacting performance.

Figure 4:
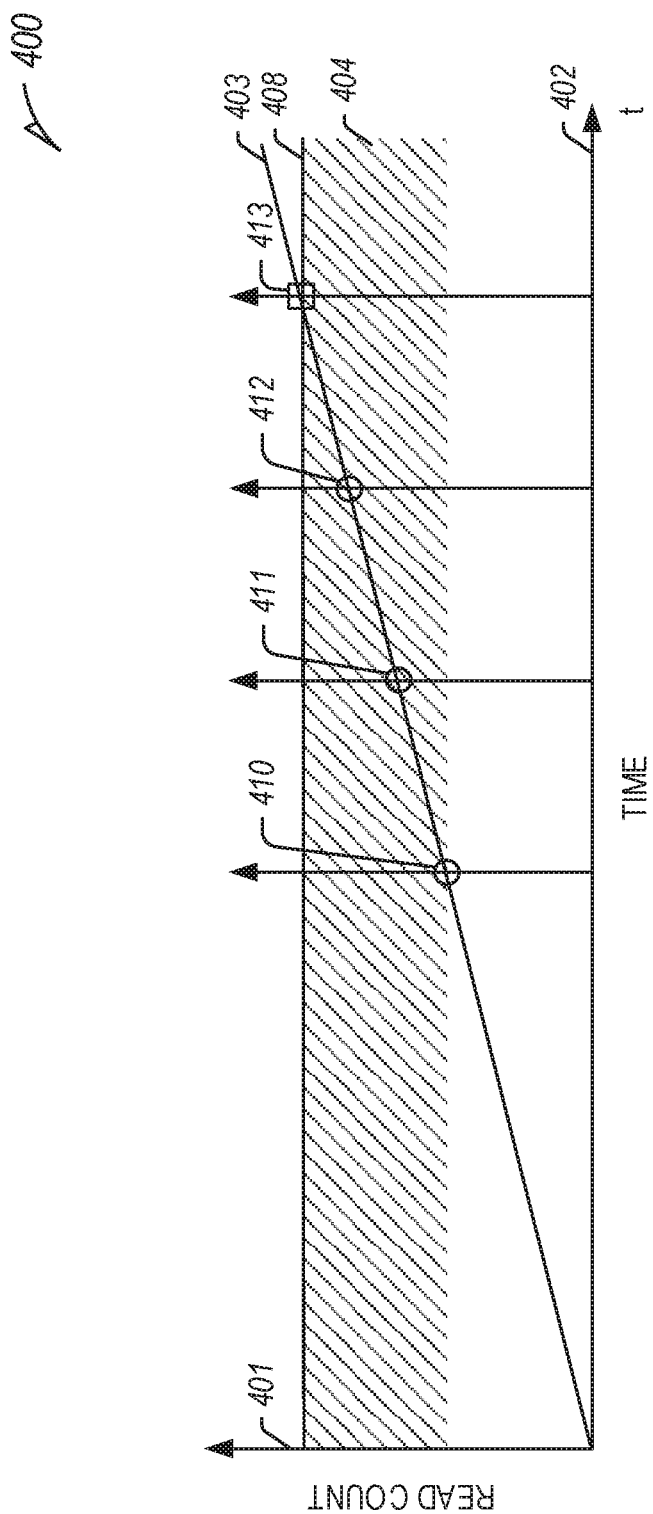

FIG. 4 illustrates an example relationship 400 between a read count 401 and a time (t) 402 for different scan events, including first, second, third, and fourth scan events 410-413, each within a threshold zone 404. In an example, accumulated read counts 403 of first, second, third, and fourth groups of memory cells can increase at the same or a substantially similar rate. When the accumulated read counts 403 of one or more (or two or more) groups of memory cells reaches a preliminary condition, such as a threshold zone 404, a subset of the groups of memory cells in the threshold zone 404 can be scanned at periodic intervals (e.g., time intervals, etc.). The threshold zone 404 can include an upper threshold, in certain examples, similar or equal to a scan threshold 408 (e.g., a target threshold, etc.), and a lower threshold, or sub-threshold below the scan threshold 408. The groups of memory cells can be scanned sequentially, randomly, ranked by an erase count or one or more other predetermined health index or parameter.

A first group of memory cells can be scanned at the first scan event 410. A second group of memory cells can be scanned at the second scan event 411. A third group of memory cells can be scanned at the third scan event 412. A fourth group of memory cells can be scanned at the fourth scan event 413. In an example, only one group of memory cells are scanned at a time, or in a time interval (e.g., 1 second, etc.). In the absence of the threshold zone 404, each of the first, second, third, and fourth groups of memory cells would be scanned at the fourth scan event 413, at the scan threshold 408.

Similar to the scan events of FIGS. 2-4, groups of memory cells can be folded, or refreshed, when read counts reach a certain threshold, or when a raw bit error rate (RBER), read disturb errors, or one or more other indications reach a threshold in response to a scan event. In certain examples, where read counts alone are used to trigger scan events, the scan events in the examples of FIGS. 2-4 can be replaced with fold events. In other examples, the read count metric of FIGS. 2-4 can be replaced with the RBER, read disturb errors, or one or more other indications in response to the scan events.

Due to NAND scaling, block sizes are increasing. Consequently, the number of pages required to be scanned continues to increase, increasing the odds that multiple scans or folds could be triggered at the same time. Further, as QLC NAND has less read disturb capability (e.g., than SLC/MLC/TLC counterparts), such memory can trigger scans or folds more frequently. As scan and fold efforts increase, device performance under read intensive workloads can be impacted. Accordingly, scan and fold events should be distributed to avoid frequent performance bottlenecks. In an example, a target scan event threshold for a QLC NAND can include 100k reads. An adjusted scan event threshold can include, for example, 75% of the target scan event threshold (e.g., 75k reads), and staggered scan event thresholds can include, for example, 75%, 83.3%, 91.6%, etc., of the target scan event threshold (e.g., 75k reads, 83.3k reads, 91.6k reads, etc.). In an example, random scan event thresholds can include one or more of the staggered scan event thresholds. In other examples, one or more of the target, adjusted, staggered, or random scan event thresholds can include one or more other read counts, etc.

Figure 5:
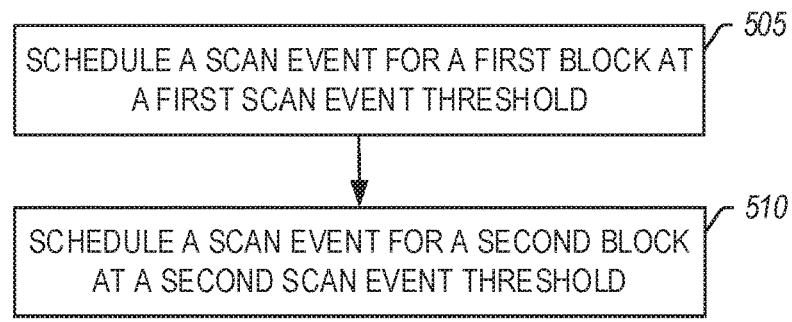
FIG. 5 illustrates a flow diagram of an example method comprising scheduling scan events for first and second groups of memory cells, in accordance with some embodiments of the present disclosure.

FIG. 5 illustrates an example method 500 including adjusting a scan event threshold for one of first or second groups of memory cells, such as blocks of memory cells or one or more other groups of memory cells of a memory device, to a threshold less than a target scan event threshold, using a processing device operably coupled to the memory device, to distribute scan events in time on the memory device.

At 505, a first scan event can be scheduled for the first group of memory cells at a first scan event threshold. The first scan event threshold can include a target scan event threshold, or one or more thresholds below the target scan event threshold. In an example, the first scan event threshold can be adjusted from the target scan event threshold, such as by the processing device.

At 510, a second scan event can be scheduled for the second group of memory cells at a second scan event threshold. The second scan event threshold can include a target scan event threshold, or one or more thresholds below the target scan event threshold, different than the first scan event threshold.

In an example, the first and second groups of memory cells can be configured to store information at the same bit capacity per memory cell (e.g., both blocks QLC, etc.). At the same time, bit capacities for the memory cells of first and second groups of memory cells can be a selectable one of a plurality of levels. For example, the first and second groups of memory cells can selectively include either SLC, MLC, TLC, or QLC. Different level cells can include different scan event thresholds. In an example, adjusting a scan event threshold for one of the first or second groups of memory cells can refer to adjusting a scan event threshold for a specific level with respect to other memory cells of that level, to distribute scan events in time on the memory device, such as during periods of consistent, heavy usage (e.g., high bandwidth operations, test conditions, etc.). This is different than adjusting read count thresholds due to wear leveling, or P/E cycles, or temperature. Those adjustments are made to ensure data retention. In an example, these adjustments can be made to avoid multiple scan events within a specified time period, improving device performance by distributing scan or fold events in time on the memory device.

Figure 6:
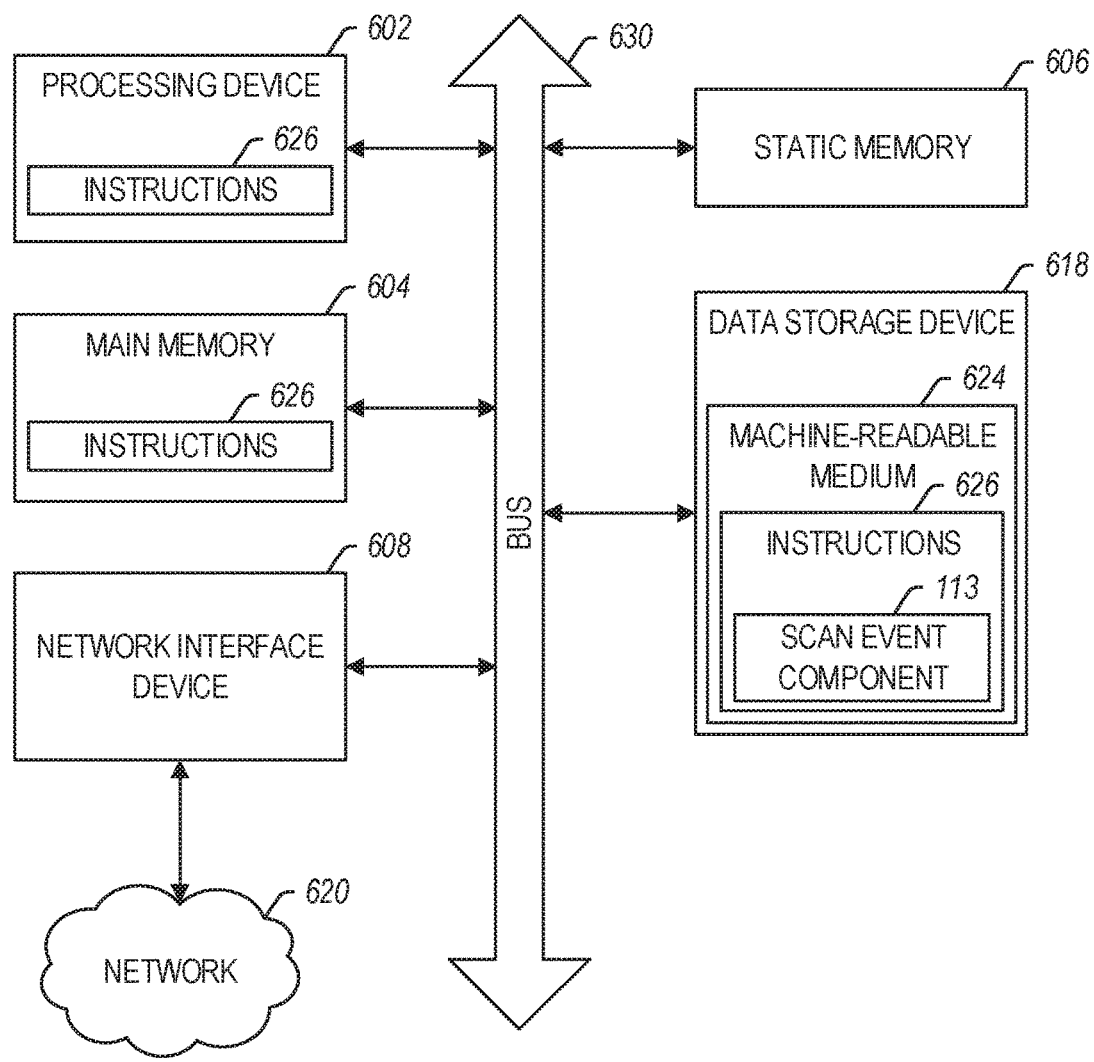
FIG. 6 illustrates an example computer system in which embodiments of the present disclosure may operate.

FIG. 6 illustrates an example machine of a computer system 600 within which a set of instructions, for causing the machine to perform any one or more of the methodologies discussed herein, can be executed. In some implementations, the computer system 600 can correspond to a host system (e.g., the host system 120 of FIG. 1) that includes or utilizes a memory system (e.g., the memory system 110 of FIG. 1) or can be used to perform the operations of a controller (e.g., to execute an operating system to perform operations corresponding to the scan event component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random-access memory (DRAM) such as synchronous DRAM (SDRAM) or Rambus DRAM (RDRAM), etc.), a static memory 606 (e.g., flash memory, static random-access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions or software 626 embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory system 110 of FIG. 1.

In one implementation, the instructions 626 include instructions to implement functionality corresponding to a write parameter handler (e.g., the scan event component 113 of FIG. 1). While the machine-readable storage medium 624 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

EXAMPLES

An example (e.g., "Example 1") of subject matter (e.g., a system) can include a memory device comprising multiple groups of memory cells, the groups comprising a first group of memory cells and a second group of memory cells configured to store information at a same bit capacity per memory cell; and a processing device operably coupled to the memory device, the processing device configured to adjust a scan event threshold for one of the first or second groups of memory cells to a threshold less than a target scan event threshold for the first and second groups of memory cells to distribute scan events in time on the memory device.

In Example 2, the subject matter of Example 1 can optionally be configured such that a scan event for a group of memory cells comprises a read disturb scan for the group of memory cells, and wherein the scan event threshold comprises a read count threshold, and the target scan event threshold for the first group of memory cells is the same as the target scan event threshold for the second group of memory cells.

In Example 3, the subject matter of any one or more of Examples 1-2 can optionally be configured such that the bit capacities for the memory cells of the first and second groups of memory cells are a selectable one of a plurality of levels, and the group of memory cells comprises a block of memory cells, each block comprising multiple pages of memory cells.

In Example 4, the subject matter of any one or more of Examples 1-3 can optionally be configured such the scan event threshold for a group of memory cells comprises a time after reaching a preliminary condition, and the preliminary condition comprises a read count threshold or sub-threshold for the group of memory cells less than the target scan event threshold.

In Example 5, the subject matter of any one or more of Examples 1-4 can optionally be configured such that to adjust the scan event threshold for one of the first or second groups of memory cells, the processing device is configured to randomly assign the scan event threshold for one of the first or second groups of memory cells within a range of scan event thresholds less than or equal to the target scan event threshold for the first and second groups of memory cells, or stagger the scan event threshold for the first group of memory cells with respect to the scan event threshold for the second group of memory cells.

In Example 6, the subject matter of any one or more of Examples 1-5 can optionally be configured such that, to adjust a scan event threshold for one of the first or second groups of memory cells, the processing device is configured to increase a read count for the first group of memory cells by a first amount, in addition to the number of reads of the first group of memory cells, wherein the scan event threshold for the first group of memory cells comprises an effective scan event threshold, taking into account the increased read count.

In Example 7, the subject matter of any one or more of Examples 1-6 can optionally be configured such that, to adjust a scan event threshold for one of the first or second groups of memory cells, the processing device is configured to schedule scan events for the first and second groups of memory cells at different times after reaching a scan event sub-threshold, lower than a scan event upper threshold.

In Example 8, the subject matter of any one or more of Examples 1-7 can optionally be configured such that the processing device is configured to: perform a scan event, comprising a read disturb scan, for one of the first or second groups of memory cells at the adjusted scan event threshold: and schedule a fold event for one of the first or second groups of memory cells in response to the scan event.

An example (e.g., "Example 9") of subject matter (e.g., a method) can include adjusting a scan event threshold for one of a first group of memory cells or a second group of memory cells of a memory device, using a processing device, to a threshold less than a target scan event threshold for the first and second groups of memory cells to distribute scan events in time on the memory device, wherein the memory device comprises multiple groups of memory cells, comprising the first and second groups of memory cells, and wherein the first and second groups of memory cells are configured to store information at a same bit capacity per memory cell.

In Example 10, the subject matter of Example 9 can optionally be configured such that a scan event for a group of memory cells comprises a read disturb scan for the group of memory cells, wherein the scan event threshold comprises a read count threshold, and the target scan event threshold for the first group of memory cells is the same as the target scan event threshold for the second group of memory cells.

In Example 11, the subject matter of any one or more of Examples 9-10 can optionally be configured such that the bit capacities for the memory cells of the first and second groups of memory cells are a selectable one of a plurality of levels, and the group of memory cells comprises a block of memory cells, each block comprising multiple pages of memory cells.

In Example 12, the subject matter of any one or more of Examples 9-11 can optionally be configured such that the scan event threshold for a group of memory cells comprises a time after reaching a preliminary condition, and the preliminary condition comprises a read count threshold or sub-threshold for the group of memory cells less than the target scan event threshold.

In Example 13, the subject matter of any one or more of Examples 9-12 can optionally be configured such that adjusting the scan event threshold comprises: randomly assigning the scan event threshold for one of the first or second groups of memory cells within a range of scan event thresholds less than or equal to the target scan event threshold for the first and second groups of memory cells; or staggering the scan event threshold for the first group of memory cells with respect to the scan event threshold for the second group of memory cells.

In Example 14, the subject matter of any one or more of Examples 9-13 can optionally be configured such that adjusting the scan event threshold comprises: increasing a read count for the first group of memory cells by a first amount, in addition to the number of reads of the first group of memory cells, and the scan event threshold for the first group of memory cells comprises an effective scan event threshold, taking into account the increased read count.

In Example 15, the subject matter of any one or more of Examples 9-14 can optionally be configured such that adjusting the scan event threshold comprises: scheduling scan events for the first and second groups of memory cells at different times after reaching a scan event sub-threshold, lower than a scan event upper threshold.

In Example 16, the subject matter of any one or more of Examples 9-15 can optionally be configured to include performing a scan event, comprising a read disturb scan, for one of the first or second groups of memory cells at the adjusted scan event threshold: and scheduling a fold event for one of the first or second groups of memory cells in response to the scan event.

An example (e.g., "Example 17") of subject matter (e.g., a system) can include a memory device comprising multiple groups of memory cells, the groups comprising a first group of memory cells and a second group of memory cells configured to store information at a same bit capacity per memory cell: and a processing device operably coupled to the memory device, the processing device configured to: adjust a fold event threshold for one of the first or second groups of memory cells to a threshold less than a target fold event threshold for the first and second groups of memory cells to distribute fold events in time on the memory device.

In Example 18, the subject matter of Example 17 can optionally be configured such that a fold event for a group of memory cells comprises writing data from the group of memory cells to another group of memory cells, wherein the fold event threshold comprises a read count threshold, and the target fold event threshold for the first group of memory cells is the same as the target fold event threshold for the second group of memory cells.

In Example 19, the subject matter of any one or more of Examples 17-18 can optionally be configured such that the bit capacities for the memory cells of the first and second groups of memory cells are a selectable one of a plurality of levels, and the group of memory cells comprises a block of memory cells, each block comprising multiple pages of memory cells.

In Example 20, the subject matter of any one or more of Examples 17-19 can optionally be configured such that the fold event threshold for a group of memory cells comprises a time after reaching a preliminary condition, and the preliminary condition comprises a read count threshold or sub-threshold for the group of memory cells less than the target fold event threshold.

An example (e.g., "Example 21") of subject matter (e.g., a system) can include a memory device comprising multiple groups of memory cells, the groups comprising a first group of memory cells and a second group of memory cells, and a processing device operably coupled to the memory device, the processing device configured to schedule scan events for the first and second groups of memory cells at different times after reaching a scan event sub-threshold, lower than a scan event upper threshold.

An example (e.g., "Example 22") of subject matter (e.g., a system) can include a memory device comprising multiple groups of memory cells, the groups comprising a first group of memory cells and a second group of memory cells, and a processing device operably coupled to the memory device, the processing device configured to increase a read count for a first group of memory cells by a first amount, different than for in addition to the number of reads of the first group of memory cells.

An example (e.g., "Example 23") of subject matter (e.g., a system) can include a memory device comprising multiple groups of memory cells, the groups comprising a first group of memory cells and a second group of memory cells: and a processing device operably coupled to the memory device, the processing device configured to schedule fold events for the first and second groups of memory cells at different fold event thresholds.

In Example 24, the subject matter of Example 23 can optionally be configured such that, to schedule fold events for the first and second groups of memory cells, the processing device is configured to schedule scan events for the first and second groups of memory cells at different times after reaching a fold event sub-threshold, lower than a fold event upper threshold.

In Example 25, the subject matter of any one or more of Examples 23-24 can optionally be configured such that the fold event thresholds are read count thresholds for the first and second groups of memory cells, or read disturb scan error rate thresholds for the first and second groups of memory cells in response to a read disturb scan.

An example (e.g., "Example 26") of subject matter (e.g., a system) can include a memory device comprising multiple groups of memory cells, the groups comprising a first group of memory cells and a second group of memory cells; and a processing device operably coupled to the memory device, the processing device configured to schedule scan events for the first and second groups of memory cells at different scan event thresholds.

In Example 27, the subject matter of Example 26 can optionally be configured such that, to schedule scan events for the first and second groups of memory cells, the processing device is configured to: schedule a scan event for the first group of memory cells at a first scan event threshold, and schedule a scan event for the second group of memory cells at a second scan event threshold, different than the first scan event threshold.

An example (e.g., "Example 28") of subject matter (e.g., a system or apparatus) can optionally combine any portion or combination of any portion of any one or more of Examples 1-27 to include "means for" performing any portion of any one or more of the functions or methods of Examples 1-27, or a "machine-readable medium" (e.g., non-transitory, etc.) comprising instructions that, when performed by a machine, cause the machine to perform any portion of any one or more of the functions or methods of Examples 1-27.

What is claimed is:

1. A system comprising:
   a memory device comprising a plurality of groups of memory cells, the plurality of groups comprising a first group of memory cells and a second group of memory cells, the first group of memory cells being separate from the second group of memory cells, each of the first group of memory cells and the second group of memory cells being configured to store information at a same bit capacity per memory cell; and
   a processing device operably coupled to the memory device, the processing device configured to perform operations comprising:
      adjusting either a first scan event threshold for the first group of the memory cells or a second scan event threshold for the second group of memory cells, to a value less than a target scan event threshold for the first and second groups of memory cells, to distribute scan events triggered on the memory device over time, the first scan event threshold comprising a first read count value for triggering a first scan event for the first group of the memory cells, and the second scan event threshold comprising a second read count value for triggering a second scan event for the second group of the memory cells.

2. The system of claim 1, wherein the first scan event comprises a read disturb scan for the group of memory cells.

3. The system of claim 1, wherein the same bit capacity per memory cell for the first and second groups of memory cells is a selectable one of a plurality of levels, and
   wherein the group of memory cells comprises a block of memory cells, each block comprising multiple pages of memory cells.

4. The system of claim 1, wherein the first scan event threshold for the first group of memory cells comprises a time after reaching a preliminary condition, and
   wherein the preliminary condition comprises a read count threshold or sub-threshold for the group of memory cells less than the target scan event threshold.

5. The system of claim 1, wherein the adjusting the first scan event threshold for the first group of the memory cells or the second scan event threshold for the second group of memory cells comprises:
   assigning the first scan event threshold or the second scan event threshold within a range of scan event thresholds less than or equal to the target scan event threshold for the first and second groups of memory cells, or
   staggering the first scan event threshold with respect to the second scan event threshold.

6. The system of claim 1, wherein the adjusting the first scan event threshold for the first group of the memory cells or the second scan event threshold for the second group of memory cells comprises:
   increasing a read count for the first group of memory cells by a first amount, in addition to a number of reads of the first group of memory cells,
   wherein the first scan event threshold for the first group of memory cells takes into account the increased read count.

7. The system of claim 1, wherein the adjusting the first scan event threshold for the first group of the memory cells or the second scan event threshold for the second group of memory cells comprises:

scheduling scan events for the first group of the memory cells and the second group of memory cells at different times after reaching a scan event sub-threshold, lower than a scan event upper threshold.

8. The system of claim 1, wherein the operations further comprise:
performing a scan event, comprising a read disturb scan, for the first group of the memory cells at the adjusted first scan event threshold; and
scheduling a fold event for the first group of the memory cells in response to the scan event for the first group of memory cells.

9. A method comprising:
adjusting, by a processing device, either a first scan event threshold for a first group of memory cells of a memory device or a second group of memory cells of the memory device, to a value less than a target scan event threshold for the first and second groups of memory cells, to distribute scan events triggered on the memory device over time,
wherein the memory device comprises a plurality of groups of memory cells, the plurality of groups comprising the first and second groups of memory cells, and wherein the first and second groups of memory cells are configured to store information at a same bit capacity per memory cell.

10. The method of claim 9, wherein the first scan event for a group of memory cells comprises a read disturb scan for the group of memory cells.

11. The method of claim 9, wherein the same bit capacity per memory cell for the first and second groups of memory cells is a selectable one of a plurality of levels, and
wherein the group of memory cells comprises a block of memory cells, each block comprising multiple pages of memory cells.

12. The method of claim 9, wherein the first scan event threshold for the first group of memory cells comprises a time after reaching a preliminary condition, and
wherein the preliminary condition comprises a read count threshold or sub-threshold for the group of memory cells less than the target scan event threshold.

13. The method of claim 9, wherein the adjusting the first scan event threshold group of the memory cells or the second scan event threshold for the second group of memory cells comprises:
assigning the first scan event threshold or the second scan event threshold within a range of scan event thresholds less than or equal to the target scan event threshold for the first and second groups of memory cells; or
staggering the first scan event threshold with respect to the second scan event threshold for the second group of memory cells.

14. The method of claim 9, wherein the adjusting the scan event threshold comprises:
increasing a read count for the first group of memory cells by a first amount, in addition to a number of reads of the first group of memory cells,
wherein the first scan event threshold for the first group of memory cells takes into account the increased read count.

15. The method of claim 9, wherein adjusting the scan event threshold comprises:
scheduling scan events for the first group of the memory cells and the second group of memory cells at different times after reaching a scan event sub-threshold, lower than a scan event upper threshold.

16. The method of claim 9, comprising:
performing a scan event, comprising a read disturb scan, for the first group of the memory cells at the adjusted first scan event threshold; and
scheduling a fold event for the first group of the memory cells in response to the scan event for the first group of memory cells.

17. A system comprising:
a memory device comprising a plurality of groups of memory cells, the plurality of groups comprising a first group of memory cells and a second group of memory cells, the first group of memory cells being separate from the second group of memory cells, each of the first group of memory cells and the second group of memory cells being configured to store information at a same bit capacity per memory cell; and
a processing device operably coupled to the memory device, the processing device configured to perform operations comprising:
adjusting either a first fold event threshold for the first group of the memory cells or a second scan event threshold for the second group of memory cells, to a value less than a target fold event threshold for the first and second groups of memory cells, to distribute fold events triggered on the memory device over time, the first fold event threshold comprising a first read count value for triggering a first fold event for the first group of the memory cells, and the second fold event threshold comprising a second read count value for triggering a second fold event for the second group of the memory cells.

18. The system of claim 17, wherein the first fold event comprises writing data from the first group of memory cells to another group of memory cells.

19. The system of claim 17, wherein the bit same bit capacity per memory cell for the first and second groups of memory cells is a selectable one of a plurality of levels, and
wherein the group of memory cells comprises a block of memory cells, each block comprising multiple pages of memory cells.

20. The system of claim 17, wherein the first fold event threshold for the first group of memory cells comprises a time after reaching a preliminary condition, and
wherein the preliminary condition comprises a read count threshold or sub-threshold for the group of memory cells less than the target fold event threshold.

* * * * *